US009472469B2

(12) United States Patent
Enders et al.

(10) Patent No.: US 9,472,469 B2
(45) Date of Patent: Oct. 18, 2016

(54) BACK GATE IN SELECT TRANSISTOR FOR EDRAM

(71) Applicant: Soitec, Crolles (FR)

(72) Inventors: Gerhard Enders, Olching (DE); Franz Hofmann, Munich (DE)

(73) Assignee: Soitec, Bernin (FR)

( * ) Notice: Subject to any disclaimer, the term of this patent is extended or adjusted under 35 U.S.C. 154(b) by 0 days.

(21) Appl. No.: 14/761,471

(22) PCT Filed: Dec. 12, 2013

(86) PCT No.: PCT/EP2013/076414
§ 371 (c)(1),
(2) Date: Jul. 16, 2015

(87) PCT Pub. No.: WO2014/114406
PCT Pub. Date: Jul. 31, 2014

(65) Prior Publication Data
US 2015/0357333 A1 Dec. 10, 2015

(30) Foreign Application Priority Data
Jan. 22, 2013 (FR) ..................... 13 50547

(51) Int. Cl.
*H01L 27/12* (2006.01)
*H01L 21/84* (2006.01)
*H01L 29/786* (2006.01)
*H01L 27/108* (2006.01)

(52) U.S. Cl.
CPC ......... *H01L 21/84* (2013.01); *H01L 27/10805* (2013.01); *H01L 27/10873* (2013.01); *H01L 27/1203* (2013.01); *H01L 29/78648* (2013.01)

(58) Field of Classification Search
CPC ....................................................... H01L 21/84
USPC ........................................................ 257/347
See application file for complete search history.

(56) References Cited

U.S. PATENT DOCUMENTS

2002/0063286 A1   5/2002   Wu et al.
2010/0019299 A1   1/2010   Bae

FOREIGN PATENT DOCUMENTS

EP          2333779          6/2011

OTHER PUBLICATIONS

Singapore Office Action for SG Application No. 11201505244Y dated Oct. 23, 2015, 7 pages.
International Search Report for International Application No. PCT/EP2013/076414 dated Mar. 4, 2015, 3 pages.

*Primary Examiner* — Anthony Ho
(74) *Attorney, Agent, or Firm* — Jeffrey T. Holman

(57) ABSTRACT

This disclosure relates to an eDRAM memory element comprising a first storage node, a bitline node for accessing the value stored in the storage node, and a select transistor, controlling access from the bitline node to the storage node, wherein the select transistor has a front gate and a back gate.

8 Claims, 7 Drawing Sheets

BACK GATE IN SELECT TRANSISTOR FOR EDRAM

CROSS-REFERENCE TO RELATED APPLICATIONS

This application is a national phase entry under 35 U.S.C. §371 of International Patent Application PCT/EP2013/076414, filed Dec. 12, 2013, designating the United States of America and published in English as International Patent Publication WO 2014/114406 A1 on Jul. 31, 2014, which claims the benefit under Article 8 of the Patent Cooperation Treaty and under 35 U.S.C. §119(e) to French Patent Application Serial No. 1350547, filed Jan. 22, 2013, the disclosure of each of which is hereby incorporated herein in its entirety by this reference.

TECHNICAL FIELD

This disclosure generally relates to the field of microelectronics. More specifically, this disclosure relates to the field of embedded DRAMs (Dynamic random-access memories) and provides a new structure that achieves improved performances via the use of a back gate on the select transistor. The same structure could also be used in DRAM applications.

BACKGROUND

DRAMs are nowadays present in most electronic devices. They usually form the main memory of microcontrollers or microprocessors. Generally speaking, DRAMs divide themselves into standalone DRAMs and embedded DRAMs (in the following, eDRAMs), depending on whether they are formed on an independent die, or on the same die of the microcontroller/microprocessor, respectively. The size and design constraints of eDRAMs are different from those of standalone DRAMs. In particular, the capacity of eDRAMs is usually smaller than the capacity of standalone DRAMs. For instance, while standalone DRAMs are nowadays in sizes of gigabytes and more, embedded DRAMs can be found in sizes ranging from a few hundred kilobytes upward.

Generally, the smallest basic block of each DRAM is provided with a storage element, which can take several forms but is mostly realized as a capacitor, and a transistor that allows or blocks access to the memory element. When the transistor allows access, the memory element can be written or read. When no access is granted, the DRAM is in retention mode. The transistor is usually named "select transistor."

In standalone DRAM, the select transistor is generally rather long, so as to reduce leakage from the memory cell and reduce short channel effects. Nowadays, the select transistor is a 3D element, which is folded in a trench. So the footprint of a long channel is small. On the other side, in embedded DRAMs, such a 3D element is usually not provided. Thus, in eDRAMs, a select transistor must be used that provides a very low off current, thereby guaranteeing an appropriate retention time for the memory cell, while still having a short channel length to save area. In order to achieve such aim, the select transistor is usually structured so as to have a high threshold voltage. This can be obtained, for instance, via an appropriate doping profile. However, the high threshold voltage is a disadvantage when the transistor has to be made conductive, since the on current cannot achieve a level sufficient for fast operation. This is usually solved by using the select transistor in overdrive mode when the select transistor has to be closed, that is, has to be made conducting, in order to read/write the value stored within the storage element.

The use of an overdrive voltage is rather complex since it requires the availability on the circuit of the high voltage itself and the select transistor has to be made resistant to overdrive operation. In particular, since the transistor has to be used in overdrive mode, its dielectric gate has to be thicker than that of a "standard" transistor as used, for instance, in the rest of the circuit. This further requires additional manufacturing steps, which increase the cost of the embedded DRAM. Additionally, such a mode of operation slows down the opening and closing of the select transistor, which, in turn, slows down the operation of the embedded DRAM. Moreover, the increase of the driving voltage to an overdrive level substantially increases the power consumption of the embedded DRAM.

BRIEF SUMMARY

This disclosure has been made in view of the problems above and it is an object thereof to provide an improved structure for embedded DRAMs which allows the operation of the embedded DRAM without the presence of the overdrive voltage. This is generally achieved by employing a dual gate structure, in particular, by adding a back gate for the select transistor.

In particular, an embodiment of this disclosure can relate to an eDRAM memory element comprising a first storage node, a bitline node for accessing the value stored in the storage node, and a select transistor, controlling access from the bitline node to the storage node, wherein the select transistor has a front gate and a back gate.

This provides the beneficial advantage that the threshold voltage of the select transistor can be controlled via the back gate, thereby allowing obtaining the desired threshold voltage without using a specific transistor for the select transistor, which is not compatible with the manufacturing of the logic transistors on the die. The back gate also helps to reduce the leakage current of the select transistor.

In some embodiments, the back gate can be configured so as to be polarized for increasing the threshold voltage of the select transistor.

This provides the beneficial advantage that the desired low off current can be achieved.

In some embodiments, the back gate can be configured so as to be polarized for increasing the threshold voltage of the select transistor during retention operation of the eDRAM memory element.

This provides the beneficial advantage that the desired low off current can be achieved during retention mode.

In some embodiments, the back gate can be configured so as to be polarized for decreasing the threshold voltage of the select transistor during reading and/or writing operation of the eDRAM memory element.

This provides the beneficial advantage that during reading and/or writing, the transistor operates quickly.

This disclosure can further relate to an eDRAM group comprising at least a first and a second eDRAM memory element, both in accordance with the above first or second embodiment, wherein the back gate of the first eDRAM memory element is connected to the back gate of the second eDRAM memory element.

This provides the beneficial advantage that a single back gate can be easily controlled for a plurality of eDRAM memory elements.

In some embodiments, the bitline node of the first eDRAM memory element can be the same as the bitline node of the second eDRAM memory element.

This provides the beneficial advantage that the size of the two memory elements can be contained to a minimum level.

This disclosure can further relate to an eDRAM group comprising at least a first and a second eDRAM memory element, both in accordance with the above first, third or fourth embodiments, wherein the back gate of the first eDRAM memory element is disconnected from the back gate of the second eDRAM memory element.

This provides the beneficial advantage that the two back gates can be independently controlled depending on the state (retention, reading, writing) of the corresponding select transistor.

In some embodiments, the bitline node of the first eDRAM memory element and the bitline node of the second eDRAM memory element can be separated by an insulation element and can be electrically connected to each other via a connection.

This provides the beneficial advantage that the two bitline nodes can be addressed with a single connection, thereby simplifying the architecture of the eDRAM group.

BRIEF DESCRIPTION OF THE DRAWINGS

The disclosure will now be described hereinafter in more detail, by way of example, using advantageous embodiments and with reference to the drawings. The described embodiments are only possible configurations in which individual features may, however, as described above, be implemented independently of each other or may be omitted. Equal elements illustrated in the drawings are provided with equal reference signs. Parts of the description relating to equal elements illustrated in the different drawings may be left out. In the drawings.

DETAILED DESCRIPTION

Figure 1:
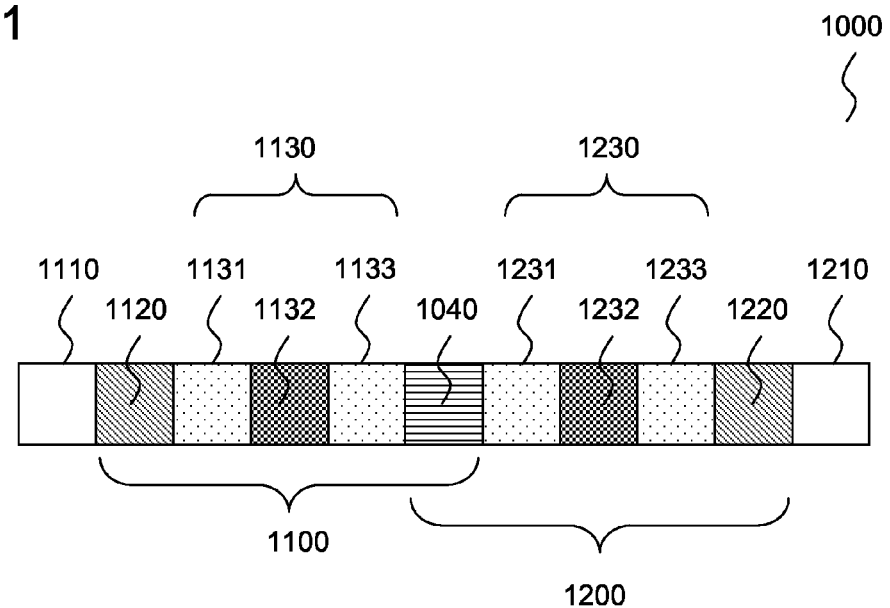
FIG. 1 schematically illustrates a top view of a DRAM cell pair 1000, which can be used in eDRAMs or standalone DRAMs.

A first DRAM cell pair 1000 will now be described with reference to FIG. 1. FIG. 1 schematically illustrates a top view of the DRAM cell pair 1000. While in the following the cell pair 1000 will be described as being used for eDRAM applications, the cell pair 1000 can be used for DRAM and/or eDRAM applications.

In particular, the embedded DRAM cell pair 1000 schematically illustrated in FIG. 1 comprises a first transistor 1130 and a second transistor 1230. The two transistors act as select transistors for two memory elements 1100 and 1200. More specifically, first transistor 1130 comprises a source 1131, a gate 1132 and a drain 1133. Similarly, second transistor 1230 comprises a drain 1231, a gate 1232 and a source 1233. Here, the areas indicated as "source" and "drain" can be interchanged and they are generally corresponding to active areas of the transistor on the two sides of the gate. Further, the eDRAM cell pair 1000 comprises a bitline node 1040, a first storage node 1120, a second storage node 1220 and two shallow trench insulations (in the following STI) 1110 and 1210. In some embodiments, the two memory elements 1100 and 1200 have a common active silicon area and are surrounded by STI or a mesa isolation, which means that outside 1220, 1233, 1232, 1231, 1040, 1133, 1132, 1131, 1120, the active silicon is etched. The storage nodes 1120 and 1220 could be realized in any suitable way for storing information. For instance, in some embodiments, they may be realized by a capacitance. However, this disclosure is not limited thereto and any technology that allows storage of information can be employed instead, such as storing information magnetically or by changing the threshold voltage of a floating body SOI transistor.

The combination of elements from first storage node 1120 to bitline node 1040 realizes a first memory element 1100, while the combination of elements from second storage node 1220 to bitline node 1040 realizes a second memory element 1200. The two memory elements 1100 and 1200, therefore, share a common bitline node 1040. This is advantageous since it reduces the space used for the eDRAM cell pair, as opposed to the case in which the two memory elements 1100 and 1200 would each have its own bitline node 1040.

Access to the information stored in storage node 1120 can be gained through gate 1132. Similarly, access to the information stored in storage node 1220 can be gained through gate 1232. In order to be able to independently access the information stored in each of memory element 1100 and 1200, an independent connection has to be provided for each of gates 1132, 1232 and for bitline contact 1040. Such an arrangement is schematically illustrated by FIG. 2.

Figure 2:
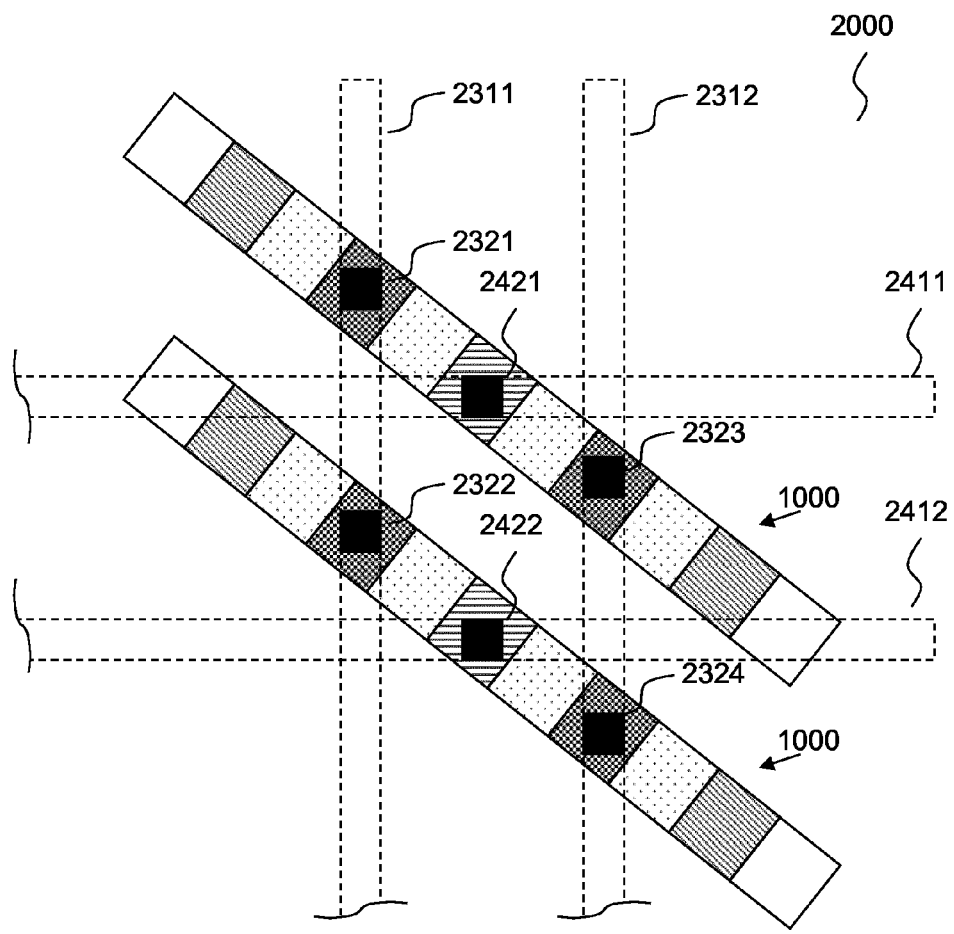
FIG. 2 schematically illustrates a top view of an eDRAM group 2000, comprising two eDRAM cell pairs 1000 of FIG. 1.

FIG. 2 schematically illustrates a top view of an eDRAM group 2000, comprising two eDRAM cell pairs 1000 of FIG. 1.

In particular, as can be seen in FIG. 2, eDRAM group 2000 comprises two embedded DRAM cell pairs 1000, which are slightly tilted. This is done in order to allow connection to the bitline node 1040 as well as connection to the storage nodes 1120, 1220, for each eDRAM cell pair 1000. In particular, these connections are realized with horizontal connection lines, so that the eDRAM cell pairs 1000 has to be tilted, otherwise the same horizontal connection line would pass over storage nodes 1120 and 1220 as well as over bitline node 1040. That is, in this embodiment, the nodes 1120 and 1220 are the connection to the capacitor where the charge is stored.

Thanks to the tilting of the eDRAM cell pair 1000, connections to the bitline node 1040, to the storage nodes 1120, 1220 and to the gates 1132, 1232 can be achieved with only two levels of metal, one arrayed in the horizontal direction, the other in the vertical direction. In FIG. 2, black squares at the crossing of those vertical/horizontal connections and the respective node/gate indicate the presence of a via, thereby connecting the vertical/horizontal connection to the respective node/gate. More specifically, connections 2411 and 2412 are horizontally arrayed and connected to bitline nodes 1040 of the two eDRAM cell pairs 1000, through vias 2421, 2422, respectively. Connections 2311 and 2312 are vertically arrayed and connected to gates 1132 and 1232 of the two eDRAM cell pairs 1000, through vias 2321, 2322 and 2323, 2324, respectively.

It will be clear to those skilled in the art that, while only two vertically adjacent eDRAM cell pairs 1000 have been illustrated in the eDRAM group 2000 of FIG. 2, this disclosure is not limited thereto. In particular, any number of eDRAM cell pairs 1000 can be connected in this manner, by adding eDRAM cell pairs in a matrix manner, vertically and/or horizontally adjacent. For instance, any number of eDRAM cell pairs 1000 could be placed in a vertical direction below the two represented in FIG. 2. In this configuration, all of the gates 1132 of each of the eDRAM cell pairs 1000 would be connected to connection 2311 while all of the gates 1232 of each of the eDRAM cell pairs 1000 would be connected to the connection 2312. Alternatively, or in addition, any number of eDRAM cell pairs 1000 could be placed to the left, or right, of the two eDRAM cell pairs 1000 illustrated in FIG. 2. In this case, they would share connections 2411 and 2412 (in some embodiments, also other, non-illustrated, storage node connections) with the two illustrated eDRAM cell pairs 1000 of FIG. 2. Such an array provides the beneficial advantage that the connections can be shared among a plurality of eDRAM cell pairs while still allowing individual access to each storage node in the array. For instance, in order to read the values stored in node 1120 of the uppermost eDRAM cell pair 1000, gate 1132 can be made conducting via connection 2311 and the value stored in the storage node 1120 can be retrieved via connection 2411. While not illustrated, it will be clear to those skilled in the art that such a writing and/or reading operation can be achieved via the presence of the required driving circuitry, as well as any required amplifier, etc.

Figure 3:
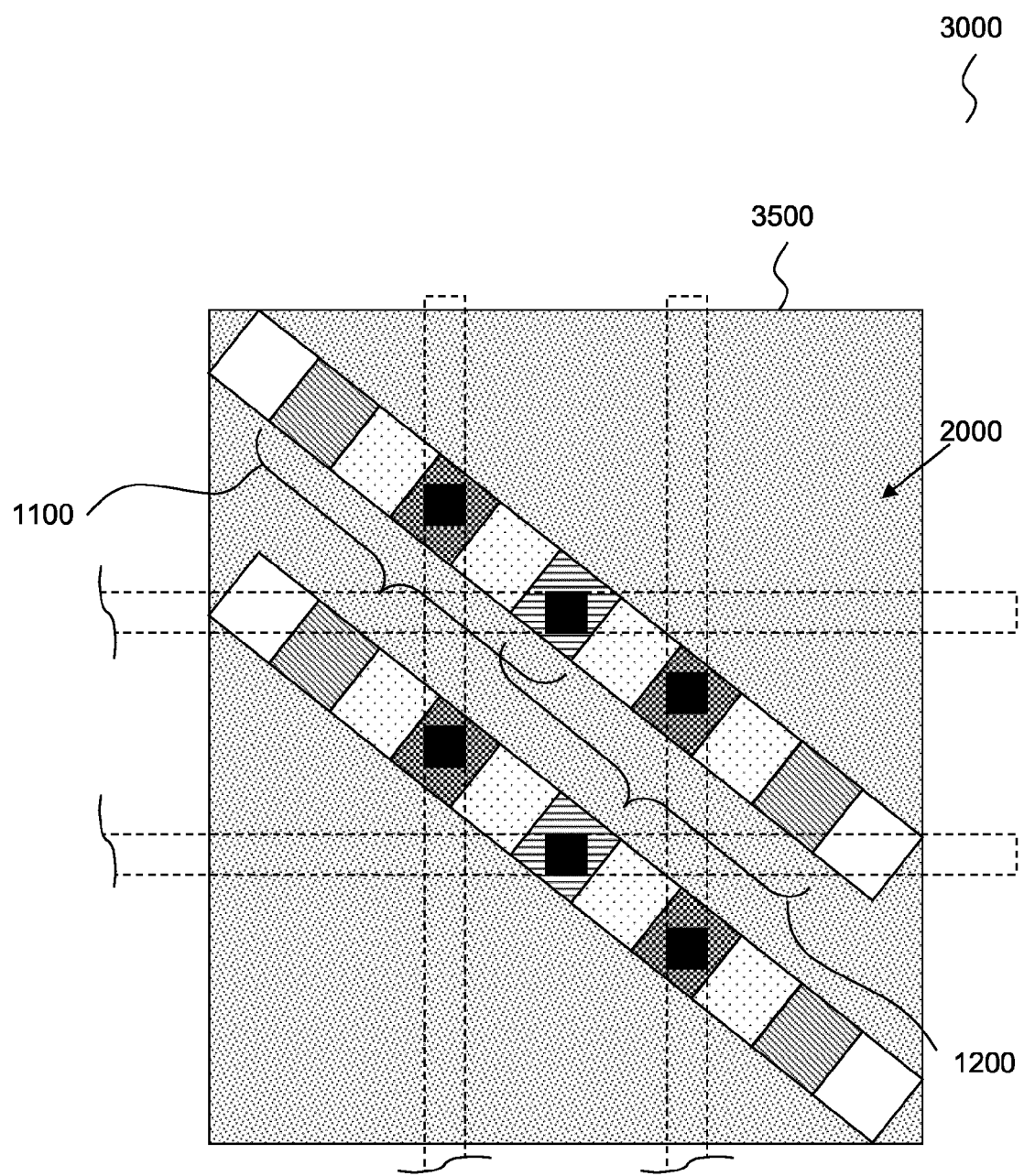
FIG. 3 schematically illustrates a top view of an eDRAM group 3000 in accordance with an embodiment of this disclosure.

FIG. 3 schematically illustrates a top view of an eDRAM group 3000 in accordance with an embodiment of this disclosure.

In particular, in FIG. 3, to the eDRAM group 2000 of FIG. 2, a back gate 3500 has been applied in order to achieve eDRAM group 3000. The back gate 3500 can be realized with any suitable technology, such as, for instance, a Silicon-On-Insulator (SOI) substrate. A specific description of one possible realization of the vertical layer placement of eDRAM group 3000 will be given further below with references to FIGS. 5 and 6. In some embodiments, all isolation in FIG. 3 could be done by mesa isolation (the active silicon is etched to the top of the buried oxide).

The presence of back gate 3500 underneath eDRAM group 2000 allows the threshold voltage of the transistors 1130 and 1230 to be controlled. In particular, the voltage on the back gate 3500 is fixed at a value that increases the threshold voltage, so that leakage current, that is, off current, is kept to an acceptable level. This is advantageous since the high threshold voltage can be achieved via the back gate and not via using a long channel for the select transistors or by doping. In this manner, the select transistors 1130 and 1230 can be realized during the same manufacturing step as all other logic transistors on the die, thereby rendering manufacturing of the eDRAM cheaper, simpler and more reliable. In order to increase the threshold voltage, known techniques can be applied. For instance, if the select transistors 1130, 1230, are N-type transistors, their threshold voltage can be increased by applying a negative voltage on the back gate 3500.

Figure 4:
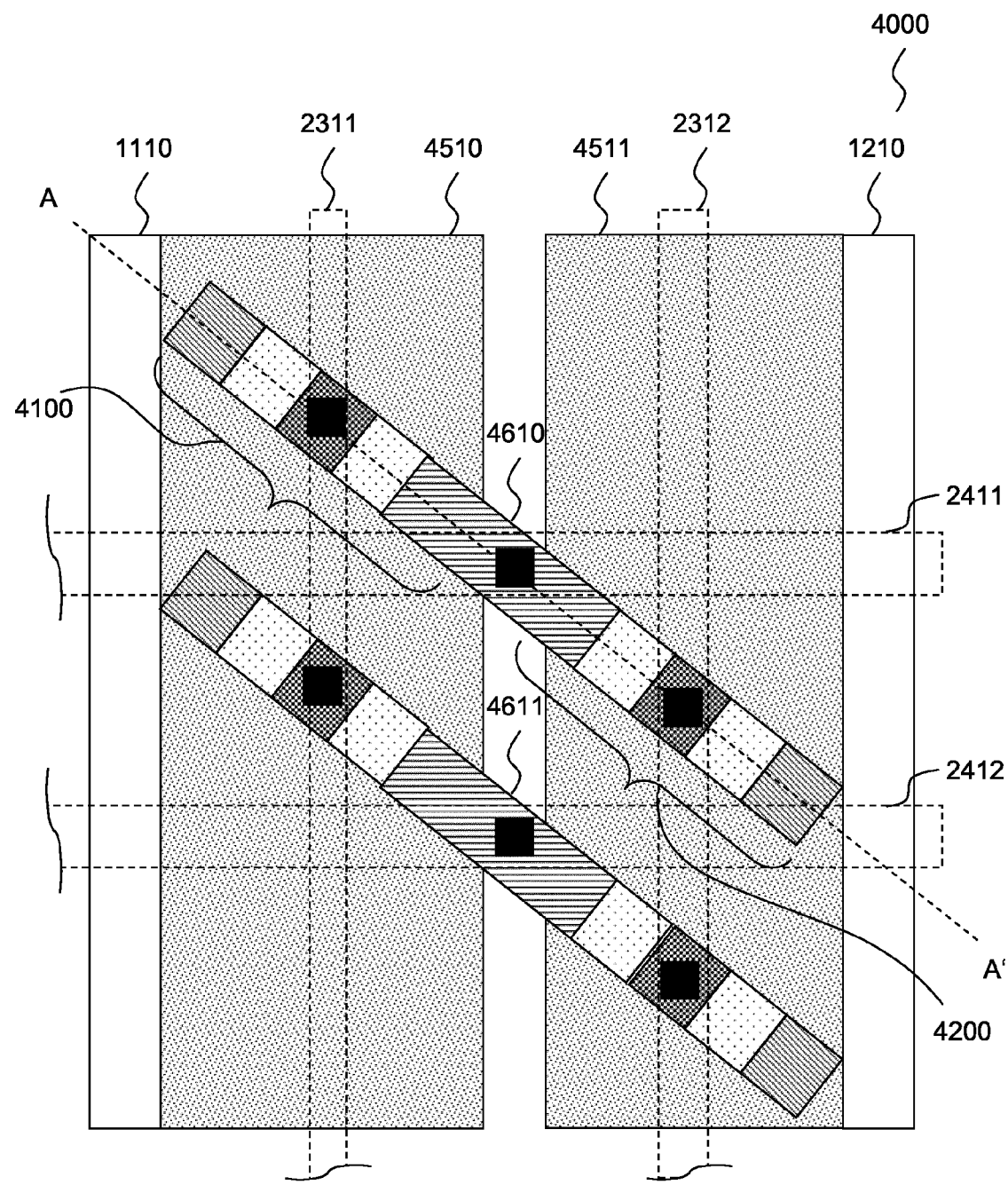
FIG. 4 schematically illustrates a top view of an eDRAM group 4000 in accordance with a further embodiment of this disclosure.

FIG. 4 schematically illustrates a top view of an eDRAM group 4000 in accordance with a further embodiment of this disclosure.

In particular, eDRAM group 4000 comprises two eDRAM cell pairs arranged in a tilted manner, such as in FIGS. 2 and 3, and two back gates 4510 and 4511. Each of the eDRAM cell pairs of FIG. 4 differs from the eDRAM cell pair 1000 of FIGS. 1 to 3 due to the fact that bitline node 1040 common to memory elements 1100 and 1200, in the embodiments of FIGS. 1-3 is substituted by two bitline nodes 1040, one for each of transistors 1130 and 1230, as will be described with reference to FIGS. 5 and 6. The two separated bitline nodes 1040 are then connected through a connection 4610, such that reading and writing of the eDRAM group 4000 can be performed as for eDRAM group 2000 with a single horizontal connection 2411, 2412, for each of the eDRAM cell pairs. Additionally, the STI 1110 of the eDRAM cell pairs are grouped, such that a single STI 1110 borders the left side of back gate 4510 and a single STI 1210 borders the right side of back gate 4512. Moreover, in some embodiments, at the upper side and lower side of memory elements 4100 and 4200, there can also be a mesa isolation where the active silicon 5003 is etched.

The separation of the two memory elements 1100 and 1200 allows their positioning over two distinct back gates 4510 and 4511, respectively. This, compared to the eDRAM group 3000 of FIG. 3, allows the two back gates to be polarized independently of each other. This is advantageous since the operation of the back gates 4510, 4511 can be combined with the operation of the corresponding transistor gates 1132, 1232. In other words, with reference to transistor 1130 and memory element 4100, when gate 1132 is closed, that is, made conducting, in order to access node 1120, back gate 4510 can be operated so as to lower the threshold of the transistor such that access to the node can be gained by using a low voltage on the gate 1132. On other hand, when transistor 1130 is opened, that is, during retention state, the back gate 4510 can be operated so as to increase the threshold voltage of transistor 1130 such that a very low leakage current will flow through the transistor with gate 1132. In this manner, all transistors that are vertically aligned, such as transistor 1130 of any of the pluralities of the eDRAM cell pairs, can be operated via a plurality of "front" gates 1132 and via a single back gate 4510. The operation is similar for all transistors 1230 of memory element 4200 and the single back gate 4511; the description thereof will, therefore, be omitted.

Such operation is advantageous since the back gate can be used to reduce leakage current, during retention state, while not necessitating a long transistor or one doped so as to have an inherent high threshold voltage, while, at the same time, the back gate can be used to allow fast access to the storage node during reading/writing of the storage node, while not necessitating the use of overdrive. Thus, the presence of an independent back gate for each row of memory elements 4100, 4200 allows fast operation of the elements, low power consumption, long retention time and the realization of the select transistor with standard manufacturing steps common to the rest of the die, which, in turn, allows reduction of costs and manufacturing complexity, thereby providing an increased yield.

Figure 5:
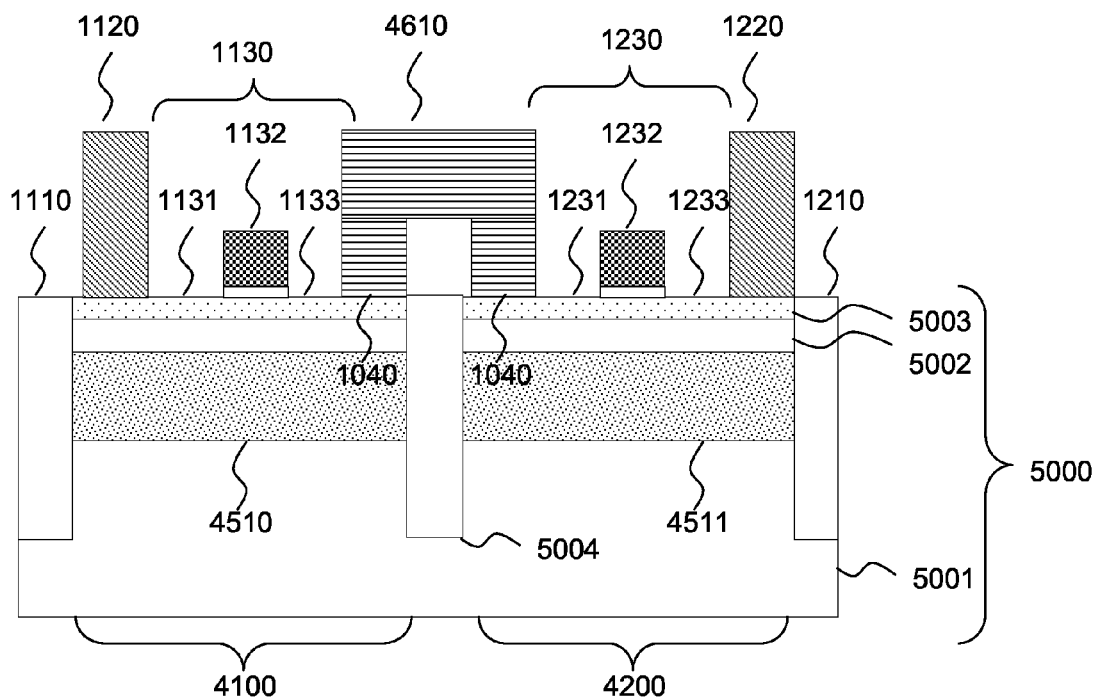
FIG. 5 schematically illustrates a cut view of one of the eDRAM cells of the eDRAM group 4000 of FIG. 4 in accordance with a further embodiment of this disclosure.

FIG. 5 schematically illustrates a cut view of one of the eDRAM cell pairs of the eDRAM group 4000 of FIG. 4 in accordance with a further embodiment of this disclosure. In particular, the cut view of FIG. 5 is taken along line A-A' of FIG. 4.

In particular, as can be seen in FIG. 5, the two transistors 1130 and 1230 are located on a substrate 5000. The substrate 5000 could be, for instance, an SOI substrate comprising a bulk semiconductor layer 5001, a buried insulator layer 5002 and a thin semiconductor layer 5003. The two transistors 1130 and 1230 are realized by using the layer 5003 as their active layer.

Storage nodes 1120 and 1220 are only schematically illustrated. As described above, the technology with which the memory element is realized could be any among several options such as a capacitance, an SOI transistor with variable threshold voltage, etc.

As can be seen in FIG. 5, the separation of the back gates 4510 and 4511 is achieved via an STI 5004 placed between the memory element 4100 and the memory element 4200. As can be seen, in place of a single bitline node 1040 being shared by both memory elements 4100 and 4200, two such nodes 1040 are present and they are connected by a connection 4610, overlapping both bitline nodes 1040. In such manner, it is still possible to use a single horizontal connection 2411, such as the one illustrated in FIG. 2 for connecting to the connection 4610.

Figure 6:
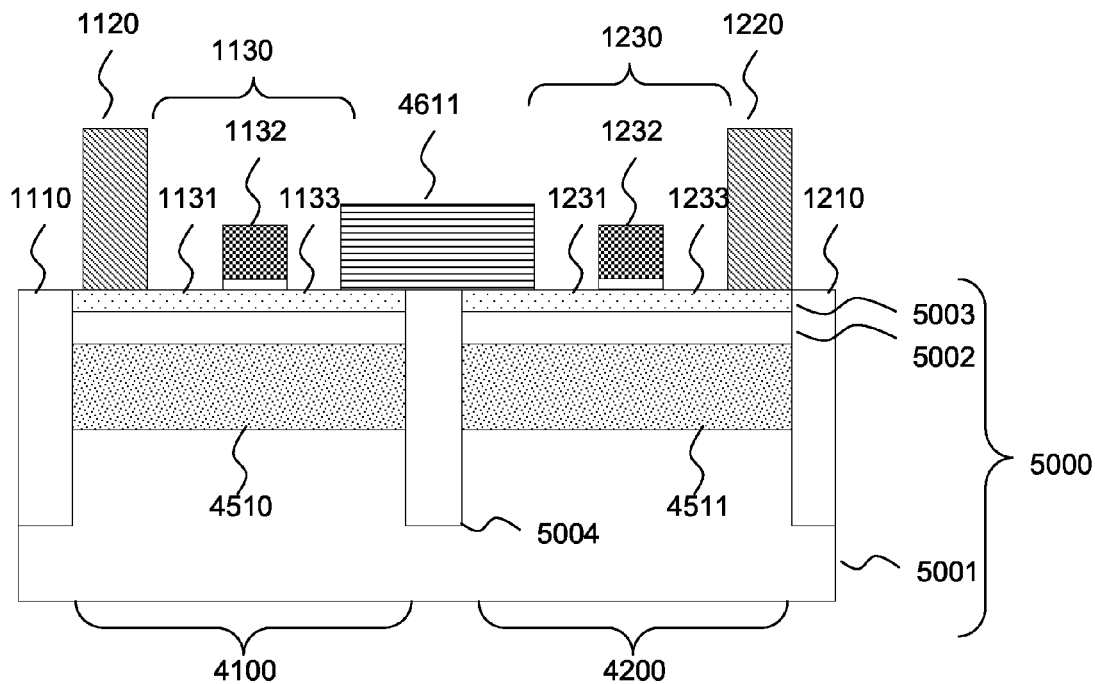
FIG. 6 schematically illustrates an alternative cut view of one of the eDRAM cells of the eDRAM group 4000 of FIG. 4 in accordance with a further embodiment of this disclosure.

FIG. 6 schematically illustrates an alternative cut view of one of the eDRAM cell pairs of the eDRAM group 4000 of FIG. 4 in accordance with a further embodiment of this disclosure. In particular, in the embodiment of FIG. 6, the two bitline nodes 1040 are not present and are replaced by a single bitline node 4611, which extends over the region occupied by bitline nodes 1040 in the embodiment of FIG. 5, as well as the STI 5004.

It will be clear to those skilled in the art that the empty spaces in FIGS. 5 and 6 can be filled by adequate materials, such as a dielectric.

Additionally, although not illustrated, the STI 5004 could be implemented so as to separate only the back gates 4510, 4511, without separating the semiconductor layer 5003 of memory element 4100 from that of memory element 4200. In this case, a single, smaller, bitline node 1040 could still be implemented, even in the presence of two back gates 4510, 4511. This could be achieved, for instance, by realizing the STI 5004 before realizing semiconductor layer 5003. Alternatively, STI 5004 could be realized by cutting through semiconductor layer 5003 but then the removed part of semiconductor layer 5003 could be reconstructed. Still alternatively, or in addition, the two back gates could not be separated by an STI, but only by an intrinsic region of the bulk layer 5001. In this case, the two back gates could be realized by doping the corresponding regions and the separation would be achieved by the reverse doping in the region between the two doped regions, substantially corresponding to the region occupied by STI 5004.

Figure 7:
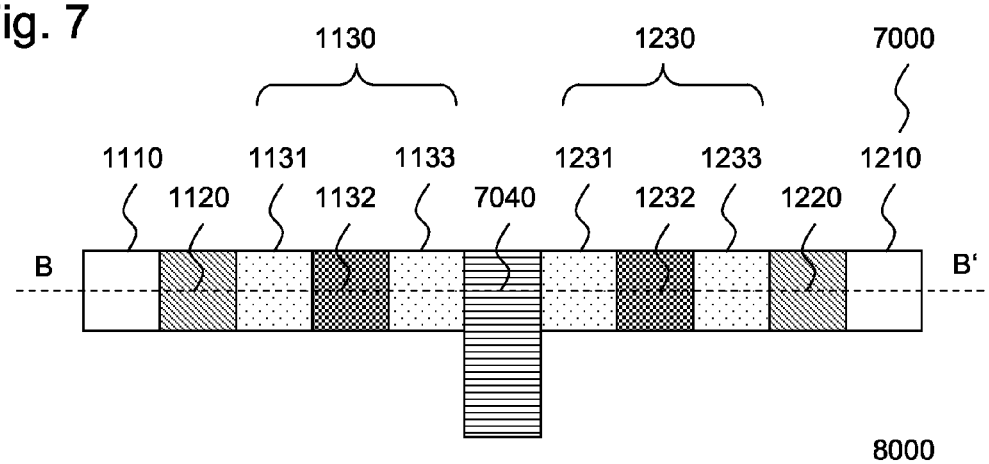
FIG. 7 schematically illustrates a top view of a DRAM cell pair 7000 that can be used in eDRAMs or standalone DRAMs.
Figure 8:
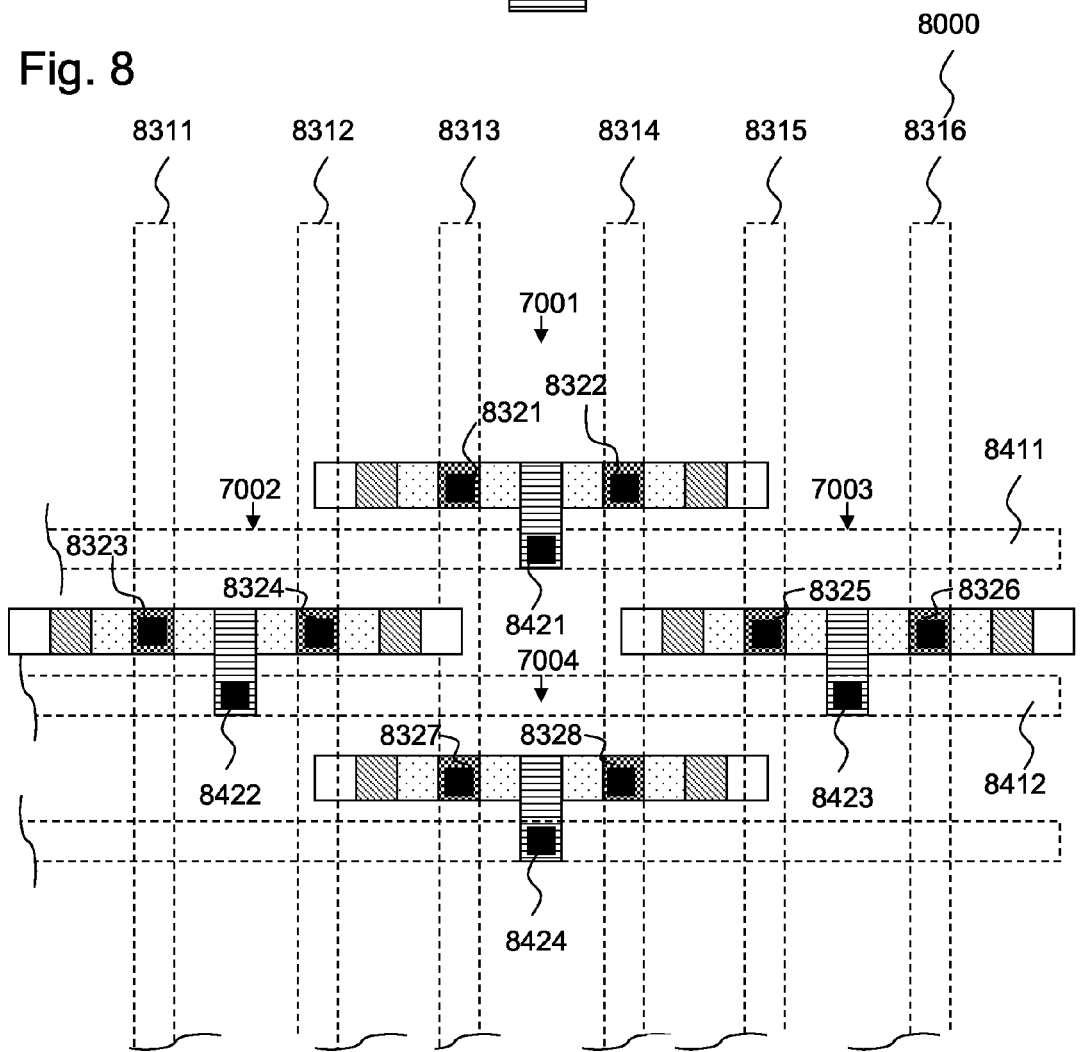
FIG. 8 schematically illustrates a top view of an eDRAM group 8000, comprising four eDRAM cell pairs 7000 of FIG. 7.

FIG. 7 schematically illustrates a top view of a DRAM cell pair 7000. While in the following the DRAM cell pair 7000 is described as being used for eDRAM applications, the cell pair 7000 can be used for DRAM and/or eDRAM applications. FIG. 8 schematically illustrates a top view of an eDRAM group 8000, comprising four eDRAM cell pairs 7000 of FIG. 7.

EDRAM cell pair 7000 differs from eDRAM cell pair 1000 in that the bitline node 7040 is shaped so as to extend out of the main linear axis B-B' of the eDRAM cell pair 7000. In other words, the bitline node 7040 extends downward (in the figure) lower than the bottom part of the elements 1110-1133 and 1210-1233. In some embodiments, outside the area occupied by elements 1220, 1233, 1232, 1231, 7040, 1133, 1132, 1131 and 1120, active silicon such as layer 5003 in FIG. 5 can be etched in a mesa isolation way.

This allows, as can be seen in FIG. 8, an array of memory cell pairs 7000 to be realized without the tilting that is required for the array of FIG. 2. Vertical connection can be made to each of the gates 1132 and 1232 of each of the memory cell pairs 7000 in FIG. 8 as it was the case in FIG. 2. However, since the storage node 1120, 1220 and the bitline node 7040 are not on the same horizontal line, connection can be made to those elements with two separate horizontal connection lines, without tilting of the memory cell pair 7000. In particular, in FIG. 8, as in FIG. 2, black squares at the crossing of vertical/horizontal connections and the respective node/gate indicate the presence of a via, thereby connecting the vertical/horizontal connection to the respective node/gate. More specifically, connections 8411 and 8412 are horizontally arrayed and connected to bitline nodes 7040 of eDRAM cell pairs 7001-7003 through vias 8421-8423, respectively. Connections 8311-8316 are vertically arrayed and connected to gates 1132 and 1232 of eDRAM cell pairs 7001-7004, through vias 8321-8328.

It will be clear to those skilled in the art that, while only four eDRAM cell pairs 7001-7004 have been illustrated in the eDRAM group 8000 of FIG. 8, this disclosure is not limited thereto. In particular, any number of eDRAM cell pairs 7000 can be connected in this manner, by adding eDRAM cell pairs in a matrix manner, vertically and/or horizontally adjacent in a manner similar to what presented for the embodiment of FIG. 2.

Figure 9:
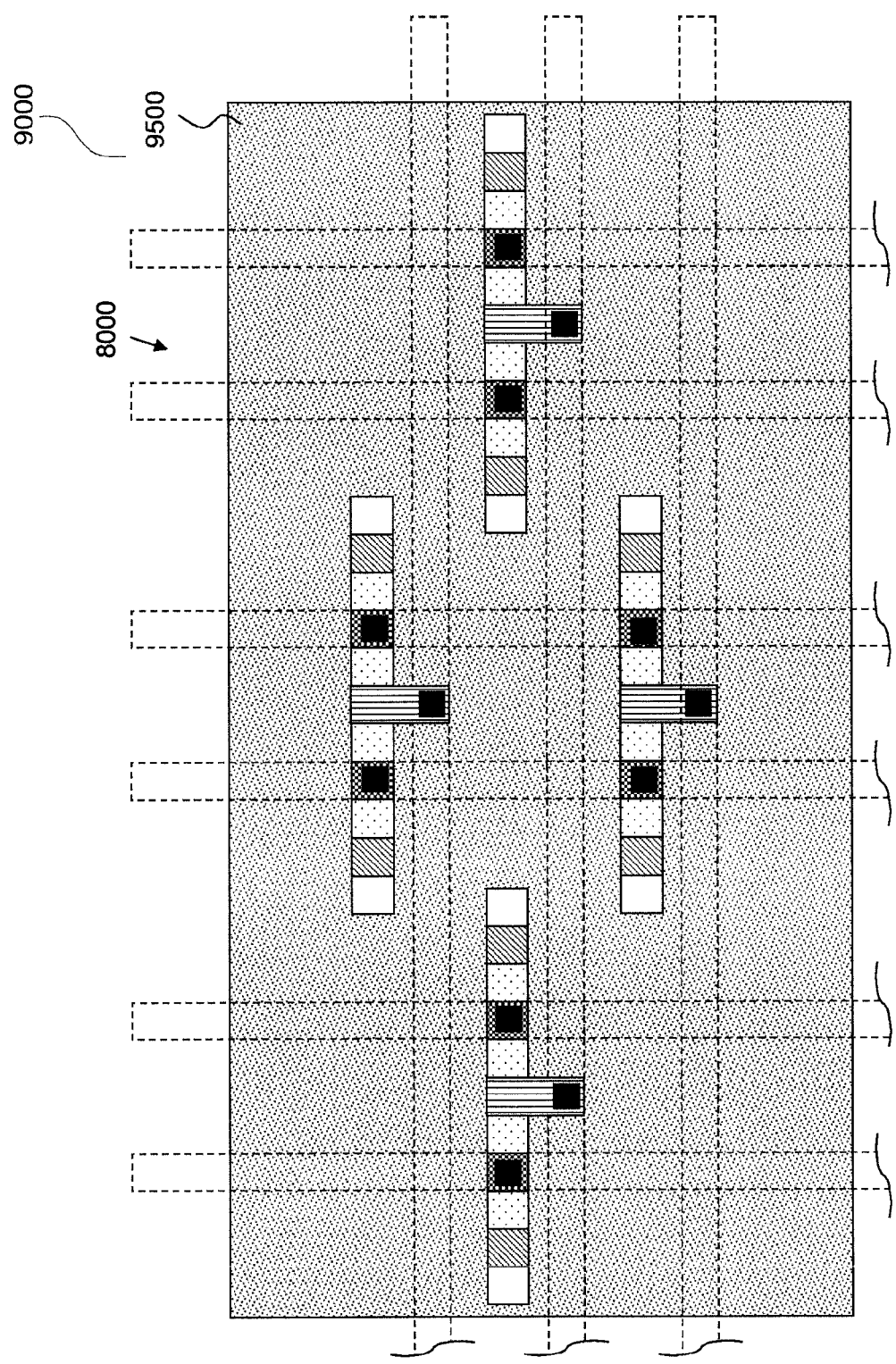
FIG. 9 schematically illustrates a top view of an eDRAM group 9000 in accordance with an embodiment of this disclosure.

FIG. 9 schematically illustrates a top view of an eDRAM group 9000 in accordance with an embodiment of this disclosure. In particular, in FIG. 9, in a manner similar to FIG. 3, a single back gate 9500 is applied to eDRAM group 8000 of FIG. 8. Thus, similar advantages as for the embodiment of FIG. 3 can be obtained, with the additional advantage that no need for tilting the eDRAM cell pairs 7000 is required. In some embodiments, all isolation in FIG. 9 could be done by mesa isolation (the active silicon is etched to the top of the buried oxide).

Figure 10:
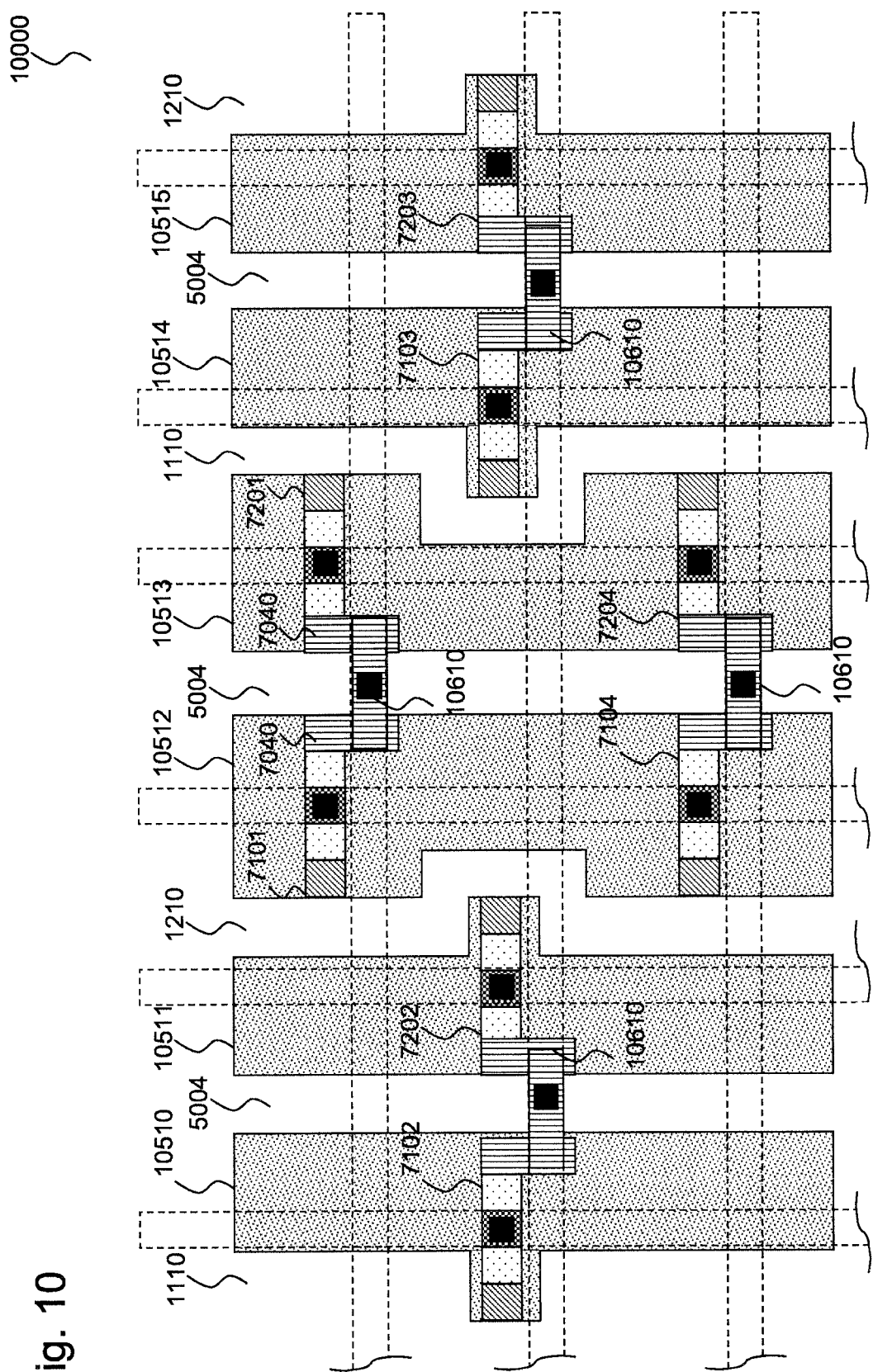
FIG. 10 schematically illustrates a top view of an eDRAM group 10000 in accordance with a further embodiment of this disclosure.

FIG. 10 schematically illustrates a top view of an eDRAM group 10000 in accordance with a further embodiment of this disclosure. In particular, in FIG. 10, in a manner similar to FIG. 4, a single back gate 10510-10515 is applied to all eDRAM memory elements that share the same vertical connection to the gate 1132 or 1232. Also, similarly to FIG. 4, the STI 1110 and 1210 are elongated, also 5004 is an STI, so as to separate neighboring back gates. Additionally, in some embodiments, at the upper side and lower side of memory elements 7101-7204, there can also be a mesa isolation where the active silicon 5003 is etched.

In particular, back gates 10510-10515 are acting on, in order, memory elements 7102, 7202, 7101 and 7104, 7201 and 7204, 7103 and 7203. Here, as in FIG. 4, eDRAM cell pairs 7001-7004 are each divided into two memory elements, so as to allow separation of the underlying backgates via an STI 5004. So memory elements 7101 and 7201 form eDRAM cell pair 7001, memory elements 7102 and 7202 form eDRAM cell pair 7002, memory elements 7103 and 7203 form eDRAM cell pair 7003, and memory elements 7104 and 7204 form eDRAM cell pair 7004. The two memory elements forming an eDRAM cell pair are separated such that, in a manner similar to the embodiment of FIG. 4, instead of a single bitline node 7040, two bitline nodes 7040 are realized and connected to each other via a connection 10610.

Thus, similar advantages as for the embodiment of FIG. 4 can be obtained, with the additional advantage that no need for tilting the eDRAM cell pairs 7000 is required.

Although in the above-described embodiments the back gates 3500, 4510, 4511, 9500, 10510-10515 are illustrated as substantially overlapping with the respective entire memory elements, this disclosure is not limited thereto. Alternatively, or in addition, at least one of the back gates could be realized so as to substantially overlap with the channel of the respective select transistors and not with the remaining structures of the memory elements.

The invention claimed is:

1. An eDRAM group comprising at least a first and a second eDRAM memory element, each of the first and the second eDRAM memory elements including a first storage node, a bitline node for accessing the value stored in the storage node, and a select transistor controlling access from the bitline node to the storage node, the select transistor having a front gate and a back gate, wherein the back gate of the first eDRAM memory element is connected to the back gate of the second eDRAM memory element, wherein the bitline node of the first eDRAM memory element is the same as the bitline node of the second eDRAM memory element.

2. An eDRAM group comprising at least a first and a second eDRAM memory element, each of the first and the second eDRAM memory elements including a first storage node, a bitline node for accessing the value stored in the storage node, and a select transistor controlling access from the bitline node to the storage node, the select transistor having a front gate and a back gate, wherein the back gate of the first eDRAM memory element is disconnected from the back gate of the second eDRAM memory element.

3. The eDRAM group of claim 2, wherein the bitline node of the first eDRAM memory element and the bitline node of the second eDRAM memory element are separated by an insulation element and are electrically connected to each other via a connection.

4. The eDRAM group of claim 1, wherein the back gate of each of the first and the second eDRAM memory elements is configured so as to be polarized for increasing the threshold voltage of the select transistor of each of the first and the second eDRAM memory elements.

5. The eDRAM group of claim 2, wherein the back gate of each of the first and the second eDRAM memory elements is configured so as to be polarized for increasing the threshold voltage of the select transistor of each of the first and the second eDRAM memory elements during retention operation of the first and the second eDRAM memory elements.

6. The eDRAM group of claim 5, wherein the back gate of each of the first and the second eDRAM memory elements is configured so as to be polarized for decreasing the threshold voltage of the select transistor of each of the first and the second eDRAM memory elements during reading and/or writing operation of the first and the second eDRAM memory elements.

7. The eDRAM group of claim 2, wherein the back gate of each of the first and the second eDRAM memory elements is configured so as to be polarized for decreasing the threshold voltage of the select transistor of each of the first and the second eDRAM memory elements during reading and/or writing operation of the first and the second eDRAM memory elements.

8. The eDRAM group of claim 2, wherein the bitline node of the first eDRAM memory element is the same as the bitline node of the second eDRAM memory element.

* * * * *